(12) United States Patent
Yoshioka et al.

(10) Patent No.: US 11,090,738 B2
(45) Date of Patent: Aug. 17, 2021

(54) SMALL-DIAMETER DRILL AND SMALL-DIAMETER DRILL MANUFACTURING METHOD

(71) Applicant: MOLDINO Tool Engineering, Ltd., Tokyo (JP)

(72) Inventors: Shogo Yoshioka, Yasu (JP); Tomoya Sasaki, Yasu (JP)

(73) Assignee: MOLDINO Tool Engineering, Ltd., Tokyo (JP)

( * ) Notice: Subject to any disclaimer, the term of this patent is extended or adjusted under 35 U.S.C. 154(b) by 0 days.

(21) Appl. No.: 16/644,662

(22) PCT Filed: Sep. 7, 2018

(86) PCT No.: PCT/JP2018/033190
§ 371 (c)(1),
(2) Date: Mar. 5, 2020

(87) PCT Pub. No.: WO2019/054289
PCT Pub. Date: Mar. 21, 2019

(65) Prior Publication Data
US 2020/0384551 A1    Dec. 10, 2020

(30) Foreign Application Priority Data

Sep. 14, 2017 (JP) .............................. JP2017-176807

(51) Int. Cl.
*B23B 51/02* (2006.01)
*C23C 14/34* (2006.01)

(52) U.S. Cl.
CPC .......... *B23B 51/02* (2013.01); *B23B 2228/08* (2013.01); *B23B 2228/10* (2013.01);
(Continued)

(58) Field of Classification Search
CPC .............. B23B 51/02; B23B 2251/443; B23B 2251/446; B23B 2251/18; B23B 2251/08;
(Continued)

(56) References Cited

U.S. PATENT DOCUMENTS

| 2,898,612 A | 8/1959 | Hofbauer |
| 2004/0101379 A1 | 5/2004 | Mabuchi et al. |
| 2007/0253787 A1 | 11/2007 | Ishii |

FOREIGN PATENT DOCUMENTS

| CN | 106756849 A | 5/2017 |
| EP | 3195971 A1 | 7/2017 |

(Continued)

OTHER PUBLICATIONS

International Search Report dated Nov. 13, 2018, issued for PCT/JP2018/033190 and English translation thereof.
(Continued)

*Primary Examiner* — Chwen-Wei Su
(74) *Attorney, Agent, or Firm* — Locke Lord LLP

(57) ABSTRACT

A small-diameter drill in which is a double margin having a diameter of 2 mm or less and a ratio of a margin length to a diameter of 3 or more, in which the margin length L in an axial direction from an outer peripheral end of a cutting edge to the rear ends of first and second margin parts and a ratio L/D to a diameter D are 3 or more, in which at least a surface of a chip discharge groove is provided with a hard coating made of nitride, in which a surface of the hard coating in the chip discharge groove has skewness (Ssk) defined in ISO25178 of less than 0, and in which the number of droplets having an equivalent circle diameter of 1.0 μm or more is 5 or less per 100 μm² in cross-section observation of the hard coating.

4 Claims, 4 Drawing Sheets

(52) U.S. Cl.
CPC ... *B23B 2251/406* (2013.01); *B23B 2251/443* (2013.01); *C23C 14/34* (2013.01)

(58) Field of Classification Search
CPC ............ B23B 2228/08; B23B 2228/10; B23B 2251/406; Y10T 408/78; C23C 14/34
See application file for complete search history.

(56) References Cited

FOREIGN PATENT DOCUMENTS

| | | |
|---|---|---|
| JP | 2004-122295 A | 4/2004 |
| JP | 2004-195560 A | 7/2004 |
| JP | 2007-313636 A | 12/2007 |
| JP | 2010-274409 A | 12/2010 |
| JP | 2014-015636 A | 1/2014 |
| JP | 2016-084505 A | 5/2016 |
| JP | 2017-109274 A | 6/2017 |
| WO | 2008/003973 A1 | 1/2008 |

OTHER PUBLICATIONS

Supplementary European Search Report dated May 19, 2021, issued for European Patent Application No. 18855697.1.

SMALL-DIAMETER DRILL AND SMALL-DIAMETER DRILL MANUFACTURING METHOD

TECHNICAL FIELD

The present invention relates to an elongated double-margin small-diameter drill in which cutting edges are formed at a cutting edge part of a tip of a drill body that rotates around an axis, first and second margin parts are formed on a land part of an outer periphery of the cutting edge part, the diameter of the cutting edge is 2 mm or less, and the ratio of a margin length and the diameter of each cutting edge is 3 or more, and a small-diameter drill manufacturing method.

Priority is claimed on Japanese Patent Application No. 2017-176807, filed on Sep. 14, 2017, the content of which is incorporated herein by reference.

BACKGROUND ART

Since it is easy for the elongated drill to cause breakage by chip clogging during a cutting step, it was necessary to add a step such as step feed to discharge chips during drilling. On the other hand, Patent Literature 1 discloses that surface roughness of a chip discharge groove of drill is set to a maximum height of 1.5S to promote the discharge of chips, and thereby, breakage resistance is improved.

CITATION LIST

Patent Literature

[PTL 1] Japanese Unexamined Patent Application, First Publication No. 2004-122295

DISCLOSURE OF INVENTION

Technical Problem

According to the research of the inventors, in an elongated drill in which a diameter D of a cutting edge is a small-diameter and a ratio L/D of a margin length L in an axis direction from an outer peripheral end of the cutting edge to a rear end of a margin part and the diameter D is large, even using the skill disclosed in Patent Literature 1, it may not be sufficient to improve breakage resistance and wear resistance.

According to the earnest examination of the inventors, it has been found that forming a hard coating on a surface of the chip discharge groove, adjusting skewness value of the hard coating, and reducing internal defects are effective in improving the breakage resistance and the wear resistance of small-diameter drills.

The invention has been made under such a background, and an object thereof is to provide the small-diameter drill having stable tool wear and excellent breakage resistance even in a case where it is elongated.

Solution to Problem

In order to achieve the above object, a small-diameter drill of an embodiment of the present invention is provided in which two chip discharge grooves opening to tip flank faces of a drill body that rotates around the axis and extending to a rear end side are formed symmetrically with respect to an axis at an outer periphery of a tip part of the drill body, cutting edges are formed at intersecting ridgeline parts between wall faces of the chip discharge grooves that face a drill rotation direction and the tip flank faces, a first margin part adjacent to a side of the chip discharge groove opposite to a drill rotation direction, and a second margin part adjacent to a side of the chip discharge groove in the drill rotation direction are formed on a land part between the chip discharge grooves, and a diameter D of the cutting edge is 2 mm or less, in which a ratio L/D of a margin length L in a direction of the axis from an outer peripheral end of the cutting edge to a rear end of each of the first and second margin parts, and the diameter D is 3 or more, in which a hard coating is provided on a surface of the drill body, in which a surface of the hard coating in the chip discharge groove has skewness (Ssk) defined in ISO25178 of less than 0, and in which the number of droplets having an equivalent circle diameter of 1.0 μm or more is 5 or less per 100 μm² in cross-section observation of the hard coating.

According to the above described configuration, chip clogging is easily suppressed, a tool wear is stabilized, and thereby a sudden breakage can also be reduced.

The small-diameter drill described above may be configuration in which a thinning part is formed at an inner periphery of a tip part of the chip discharge groove, in which the thinning part has a thinning face that faces a side opposite to the drill rotation direction, and in which the second margin part is formed from the tip flank face to the thinning face along a circumferential direction.

According to the above described configuration, the second margin part comes into sliding contact with an inner peripheral surface of a machined hole early by forming the second margin part from the tip flank face to the thinning face in the circumferential direction. As a result, the shaking of the drill body during machining can be suppressed.

A manufacturing method of the embodiment of the small-diameter drill described above is the manufacturing method of the small-diameter drill in which a diameter D of a cutting edge is 2 mm or less. The manufacturing method includes a step of forming a hard coating by a sputtering method, and a step of polishing a surface of the hard coating in a chip discharge groove to have skewness (Ssk) defined by ISO25178 of less than 0 by ejecting an abrasive against the surface of the hard coating.

According to the above described configuration, it is possible to manufacture the small-diameter drill having stable tool wear and excellent breakage resistance.

In the manufacturing method of the embodiment of the small-diameter drill described above, a maximum power density of a power pulse applied to a target may be configured to 1.0 kW/cm² or more in the sputtering method.

According to the above described configuration, it is possible to form the hard coating having excellent durability.

Advantageous Effects of Invention

According to the present invention, it is possible to provide the small-diameter drill having stable tool wear and excellent breakage resistance even in a case where it is elongated.

BEST MODE FOR CARRYING OUT THE INVENTION

Figure 1:
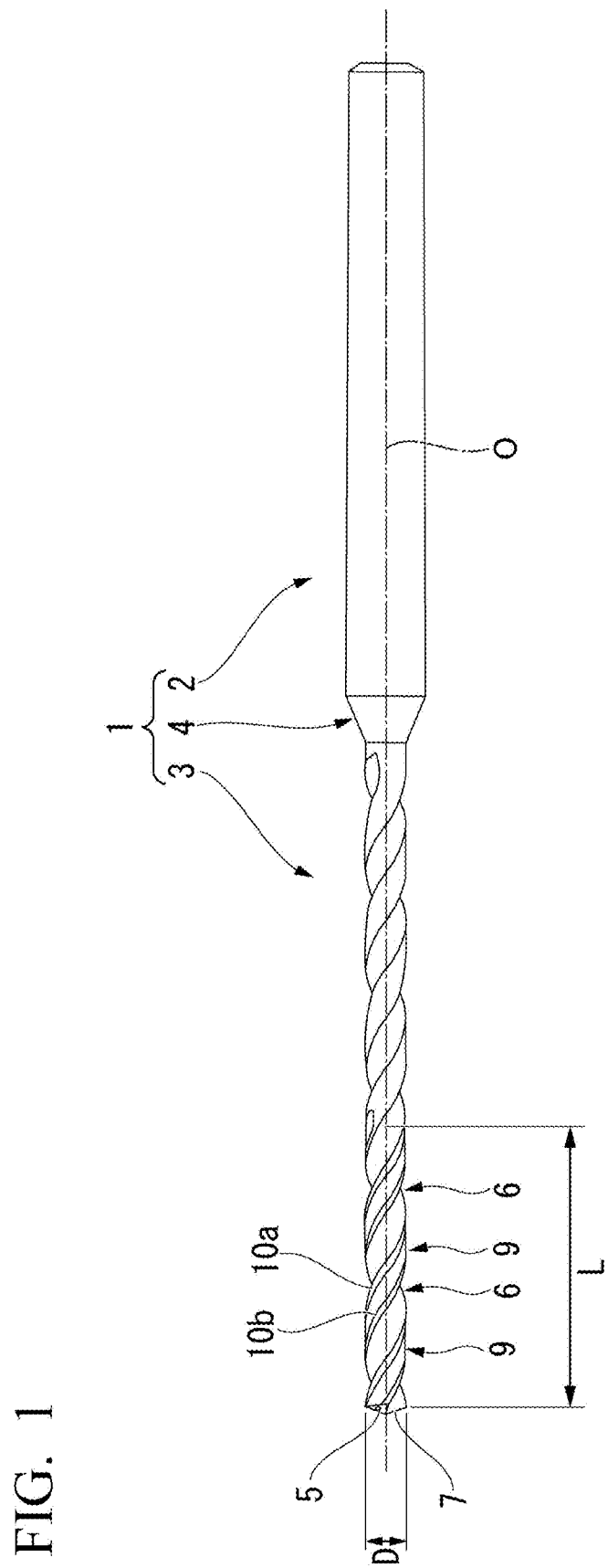
FIG. 1 is a side view illustrating an embodiment of the invention.
Figure 2:
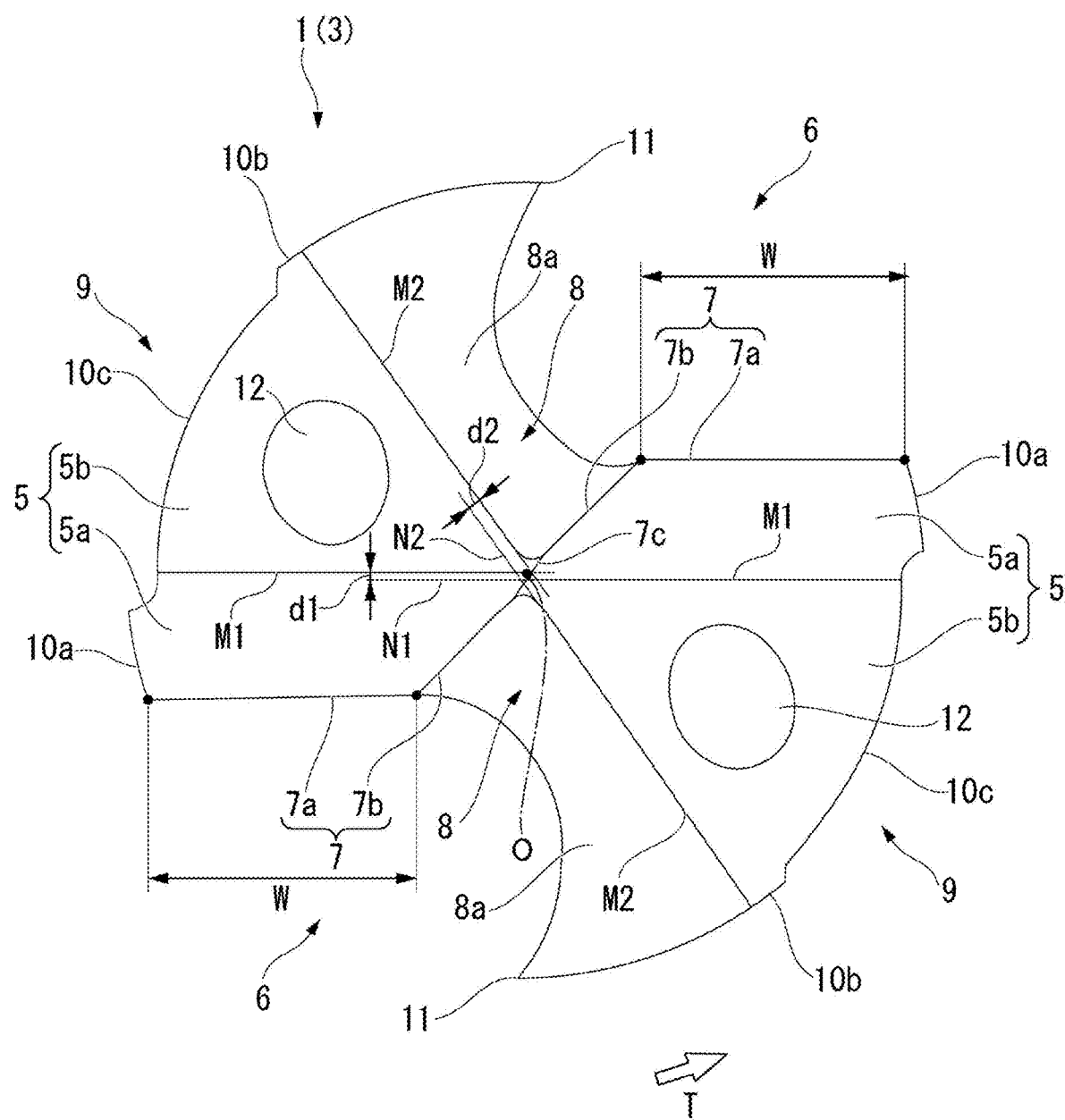
FIG. 2 is an enlarged front view of the embodiment illustrated in FIG. 1 as seen from an axis direction tip side.

FIGS. 1 and 2 illustrate an embodiment of the invention. In the present embodiment, a drill body 1 is integrally formed in a multi-stage, substantially columnar shape centered on an axis O, using hard materials, such as cemented carbide. A portion on a rear end side (a right side in FIG. 1) of the drill body 1 serves as a columnar shank part 2. A portion on a tip side (a left side in FIG. 1) of the drill body 1 serves as a cutting edge part 3 having a diameter smaller than the shank part 2 and having a substantially columnar outer shape. A portion between the shank part 2 and the cutting edge part 3 serves as a tapered neck part 4 having a truncated cone shape that gradually decreases in diameter toward the tip side.

In such a small-diameter drill, the shank part 2 is gripped by a main shaft of a machine tool and is fed to the tip side in the direction of the axis O while being rotated in a drill rotation direction T around the axis O, and thereby, drilling is performed in a workpiece made of metal, such as stainless steel or carbon steel such that a through-hole is formed by the cutting edge part 3.

A tip flank face 5 of a tip of the cutting edge part 3 opens to an outer peripheral part of the cutting edge part 3, and two chip discharge grooves 6, which are twisted toward a side opposite to the drill rotation direction T as approaching the rear end side in the direction of the axis O, are formed symmetrically with respect to the axis O. Intersecting ridgeline parts between wall faces of the chip discharge groove 6, which face the drill rotation direction T, and the tip flank face 5 is formed with a cutting edge 7 each having the wall faces as rake faces. Additionally, a thinning part 8 is formed at an inner periphery of a tip part of the chip discharge groove 6 so as to be cut away from inner peripheral parts of the wall faces of the chip discharge groove 6 that face the drill rotation direction T to outer peripheries of the wall faces that faces the side opposite to the drill rotation direction T.

As illustrated in FIG. 2, the cutting edge 7 includes a main cutting edge 7a and a thinning edge 7b. The main cutting edge 7a linearly extends from an outer periphery of the cutting edge part 3 of the drill body 1 toward an inner periphery side thereof as seen from the tip side in the direction of the axis O. The thinning edge 7b is bent at an obtuse angle with respect to the main cutting edge 7a at an inner periphery of the main cutting edge 7a as seen from the tip side in the direction of the axis O and extends toward the axis O. The thinning edge 7b is formed at an intersecting ridgeline part between a wall face of the thinning part 8, which faces the drill rotation direction T, and the tip flank face 5. A diameter D of the cutting edge 7, that is, the diameter of a circle that is formed on a rotation track around the axis O by an outer peripheral end of the cutting edge 7 is 2 mm or less and is 1 mm in the present embodiment.

A difference between lengths W of two linear main cutting edges 7a as seen from the tip side in the direction of the axis O, that is, a difference between lengths from outer peripheral ends of two cutting edges 7 (outer peripheral ends of two main cutting edges 7a) as seen from the tip side in the direction of the axis O to intersection points between the main cutting edge 7a and the thinning edge 7b is 0.04 mm or less. In addition, the length W of the main cutting edge 7a is longer than the length of the thinning edge 7b as seen from the tip side in the direction of the axis O. Moreover, the thinning edge 7b do not reach the axis O, and a chisel 7c orthogonal to the axis O is formed as an intersecting ridgeline between two tip flank faces 5 between thinning edges 7b of the two cutting edges 7.

Additionally, a first margin part 10a and a second margin part 10b are formed on an outer peripheral surface of a land part 9 that is a portion between two chip discharge grooves 6 in the outer peripheral part of the cutting edge part 3. The first margin part 10a is adjacent to the side of the chip discharge groove 6 opposite to the drill rotation direction T, that is, the cutting edge 7 side. The second margin part 10b is adjacent to the side of the chip discharge groove 6 in the drill rotation direction T, that is, a heel 11 side. Outer peripheral surfaces of the first and second margin parts 10a and 10b are formed so as to be located on a cylindrical surface, centered on the axis O, of a diameter equal to the diameter D of the cutting edge 7, that is, the diameter of the circle formed in the rotation track around the axis O by the outer peripheral end of the cutting edge 7. In the present embodiment, the first and second margin parts 10a and 10b are formed at both ends in the circumferential direction on the outer peripheral surface of the land part 9.

Moreover, a ratio L/D of a margin length L in the direction of the axis O from the outer peripheral end of the cutting edge 7 to a rear end of the first and second margin part 10a or 10b to the diameter D is 3 or more and is about 7 in the present embodiment. Therefore, the small-diameter drill of the present embodiment is a double-edge double-margin elongated small-diameter twist drill. In addition, in a case where the positions of the rear ends of the first and second margin parts 10a and 10b in the direction of the axis O are different from each other, the margin length L is a length up to the rear end of a shorter margin part.

Here, in the present embodiment, as illustrated in FIG. 1, the first and second margin parts 10a and 10b are formed up to a middle part of the cutting edge part 3, and the outer peripheral surface of the cutting edge part 3 on the rear end side with respect to this middle part is a cylindrical surface centered on the axis O of the diameter D. Additionally, although not illustrated, when the drill body is seen from a direction perpendicular to the direction of the axis O, the width in the circumferential direction of the first margin part 10a is larger than the width in the circumferential direction of the second margin part 10b in a range of less than about 0.6 times the diameter D from the tip side in the direction of the axis O. When the drill body is seen from the direction perpendicular to the direction of the axis O, the width in the circumferential direction of the first margin part 10a is approximately equal to the width in the circumferential direction of the second margin part 10b in a range of less than about 0.7 times the diameter D from the tip side in the direction of the axis O.

Moreover, a portion between the first and second margin parts 10a and 10b of the land part 9 serves as an outer peripheral relief face 10c located on the cylindrical surface, centered on the axis O, having a diameter slightly smaller than the above diameter D.

The tip flank face 5 extends toward the rear end side of the drill body 1 as approaching the side opposite to the drill rotation direction T from the cutting edge 7 and is formed so as to extend toward the rear end side of the drill body 1 as approaching an outer peripheral side. Accordingly, a predetermined flank angle and a predetermined tip angle are given to the cutting edge 7. Moreover, the tip flank face 5 includes a first tip flank face 5a and a second tip flank face 5b. The first tip flank face 5a has a certain small flank angle connected to the side of the cutting edge 7 opposite to the drill rotation direction T. The second tip flank face 5b is connected to a farther side of the first tip flank face 5a opposite to the drill rotation direction T. The second tip flank face 5b has a certain larger flank angle than the first tip flank face 5a.

Additionally, a thinning face 8a, which is a wall face that faces the side of the thinning part 8 opposite to the drill rotation direction T, intersects the side of the second tip flank face 5b opposite to the drill rotation direction T. In addition, two coolant holes 12 are drilled symmetrically with respect to the axis O by the drill body 1 so as to be twisted in accordance with the twist of the chip discharge groove 6 from the rear end surface of the shank part 2. The coolant holes 12 open to the second tip flank faces 5b of the tip flank faces 5 through the land part 9 of the cutting edge part 3. During drilling, a coolant is supplied to the cutting edges 7 or a cutting region of the workpiece via the coolant holes 12.

Moreover, as seen from the tip side in the direction of the axis O, a first intersecting ridgeline M1 that is an intersecting ridgeline between the first and second tip flank faces 5a and 5b is formed in a straight line extending parallel to the main cutting edge 7a of the cutting edge 7. Additionally, a second intersecting ridgeline M2, which is an intersecting ridgeline between the second tip flank face 5b and the thinning face 8a, is also formed in a straight line extending in a direction intersecting the first intersecting ridgeline M1 at an acute angle as seen from the tip side in the direction of the axis O.

As seen from the tip side in the direction of the axis O, a first extension line N1, which is an extension line extending from the first intersecting ridgeline M1 in one tip flank face 5 to the other tip flank face 5 side is located on the side in the drill rotation direction T with respect to the first intersecting ridgeline M1 of the other tip flank face 5, between the two tip flank faces 5 connected to sides of the two cutting edges 7 opposite to the drill rotation direction T. Therefore, the first intersecting ridgeline M1 and the first extension line N1 of the two tip flank faces 5 are parallel to each other as seen from the tip side in the direction of the axis O. Moreover, a distance d1 between the first extension line N1 from the one tip flank face 5 and the first intersecting ridgeline M1 of the other tip flank face 5 is in a range of 0.04 mm to 0.08 mm.

Additionally, as seen from the tip side in the direction of the axis O, a second extension line N2, which is an extension line extending from the second intersecting ridgeline M2 in one tip flank face 5 to the other tip flank face 5 side, extends to form a straight line with the second intersecting ridgeline M2 of the other tip flank face 5 or extends in parallel so as to be located on the side in the drill rotation direction T with respect to the second intersecting ridgeline M2 of the other tip flank face 5, between the two tip flank faces 5 connected to sides of the two cutting edges 7 opposite to the drill rotation direction T. A distance d2 between the second extension line N2 from the one tip flank face 5 of and the second intersecting ridgeline M2 of the other tip flank face 5 is in a range of 0.08 mm or less, and a lower limit value is 0 mm in a case where the second extension line N2 and the second intersecting ridgeline M2 form a straight line.

The small-diameter drill configured in this way is a double-margin drill, the first and second margin parts 10a and 10b are respectively formed on outer peripheral surfaces of two land parts 9, and during hole drilling, a total of four first and second margin parts 10a and 10b can be brought into sliding contact with an inner peripheral surface of a machined hole formed by the cutting edges 7 to support the cutting edge part 3. For this reason, for example, even during drilling of the through-hole, the cutting edge part 3 can be supported in the four first and second margin parts 10a and 10b left in sliding contact with the machined hole to prevent the shaking in a radial direction with respect to the axis O from occurring in the cutting edge part 3.

In addition, it is desirable that the second margin part 10b is formed in the circumferential direction from the second tip flank face 5b to the thinning face 8a. In this way, by forming the second margin part 10b from the side of the second tip flank face 5b in the drill rotation direction T to the thinning face 8a, the second margin part 10b comes into sliding contact with the inner peripheral surface of the machined hole early. As a result, the shaking of the drill body 1 during drilling can be suppressed. Therefore, the straightness of the drilled hole is excellent, and breakage of the drill body 1 resulting from hole bending can be suppressed.

Additionally, in the small-diameter drill having the above configuration, as seen from the tip side in the direction of the axis O, the difference between the lengths W of the two linear main cutting edges 7a that performs main cutting in the cutting edges 7 is 0.04 mm or less. In this respect, although the difference between the lengths W of the two main cutting edges 7a is ideally 0 mm, it is difficult to set the difference to 0 mm in practice. Hence, it is inevitable that a slight difference occurs. However, by setting the difference between the lengths W to an extremely small value of 0.04 mm or less, according to the drill having the above configuration, a difference between cutting resistances acting on the two main cutting edges 7a during drilling can be made small. As a result, a load to the cutting edge part 3 in the radial direction with respect to the axis O can be balanced. This can contribute to the shaking suppression of the cutting edge part 3. Moreover, it is desirable that the difference between the lengths W of the main cutting edges 7a is 0.02 mm or less.

Moreover, as seen from the tip side in the direction of the axis O, the first extension line N1 from the one tip flank face 5 is located on the side in the drill rotation direction T with respect to the first intersecting ridgeline M1 of the other tip flank face 5 between the two tip flank faces 5. As illustrated in FIG. 2, the two first tip flank faces 5a are widely formed so as to overlap each other beyond the axis O in a direction orthogonal to the first intersecting ridgeline M1. That is, by making the first tip flank face 5a having a small flank angle and a large edge angle wider, the rigidity of the cutting edge 7 with respect to the cutting resistance can be secured, and this also can suppress the shaking of the cutting edge part 3.

Moreover, as seen from the tip side in the direction of the axis O, the second extension line N2 from the one tip flank face 5 is located in a straight line with the second intersecting ridgeline M2 of the other tip flank face 5 or located on the side in the drill rotation direction T at distance d2 in a range of 0.08 mm or less with respect to the second intersecting ridgeline M2, between the two tip flank faces 5. That is, also between the two second tip flank faces 5b, at least the second intersecting ridgelines M2 overlap each other in a direction orthogonal to the second intersecting ridgeline M2 or the second tip flank faces 5b themselves overlap each other in this direction. Accordingly, the rigidity of the cutting edges 7 can also be secured by the second tip flank faces 5b having a large flank angle.

For this reason, according to the small-diameter drill having the above configuration, even in an elongated small-diameter drill in which the diameter D of each cutting edge 7 is 2 mm or less and the ratio L/D of the diameter D to the margin length L is 3 or more, by virtue of the synergistic effects resulting from the above-described configuration, the shaking of the cutting edge part 3 can be reliably suppressed, and it is possible to improve hole accuracy and also to prevent breakage or the like of the cutting edge part 3. In addition, the lower limit value of the diameter D is preferably 0.5 mm and more preferably 1.0 mm. Additionally, the upper limit value of the ratio L/D is preferably 45, and the upper limit value of L/D is more preferably 30.

In addition, the discharge amount of the coolant depends on the internal diameter of each coolant hole 12. Hence, by increasing the internal diameter of the coolant hole 12, the discharge amount of the coolant increases and chip discharge performance is excellent. In order to enhance the chip discharge performance more in the small-diameter drill, the internal diameter (diameter) of the coolant holes 12 is preferably 0.1×D or more and more preferably 0.13×D or more with respect to the diameter D of the cutting edge 7. However, if the internal diameter of the coolant hole 12 becomes too large, the rigidity of the cutting edge part 3 of the small-diameter drill decreases, and is likely to break. Hence, the internal diameter of the coolant hole 12 is preferably 0.2×D or less with respect to the diameter D of the cutting edge 7.

Here, if the difference between the lengths W of the two main cutting edges 7a as seen from the tip side in the direction of the axis O is larger than 0.04 mm, particularly, in an elongated small-diameter drill having the above configuration, there is a concern that a load to the cutting edge part 3 in the radial load with respect to the axis O cannot be balanced. Additionally, similarly, as seen from the tip side in the direction of the axis O, if the distance d1 between the first extension line N1 of the one tip flank face 5 and the first intersecting ridgeline M1 of the other tip flank face 5 is smaller than 0.04 mm, the rigidity of each cutting edge cannot be sufficiently secured as described above. Conversely, if the distance d1 is larger than 0.08 mm, there is a concern that the portion of the first tip flank face 5a having a small flank angle, particularly on the first intersecting ridgeline M1 side, comes into contact with the bottom of a machined hole to causes an increase in resistance, and wear of the tip flank face 5 is promoted.

Moreover, as seen from the tip side in the direction of the axis O, if the second extension line N2 from the tip flank face 5 is located on the side opposite to the drill rotation direction T of the second intersecting ridgeline M2 of the other tip flank face 5 (that is, if the distance d2 is less than 0 mm), there is a concern that it is insufficient to secure the rigidity of the cutting edge 7 resulting from the second tip flank face 5b as described above. If the distance d2 is larger than 0.08 mm, in a small-diameter drill in which the diameter D of the cutting edge 7 is 2 mm or less, there is also a concern that the second tip flank face 5b comes into contact with the bottom of the machined hole to cause an increase in resistance or promotion of wear.

Moreover, in a small-diameter drill in which the cross-sectional area of the chip discharge groove 6 is inevitably restricted, it is possible to make the surface of the chip discharge groove 6 smooth, thereby suppressing chip clogging to stabilize tool wear and reduce sudden breakage.

Particularly, In order to suppress the sudden breakage of the elongated small-diameter drill, variations in tool performance are large only by smoothing arithmetic mean roughness Ra or maximum height roughness Rz that is surface roughness in general line evaluation, and it is important to control surface roughness in wider surface evaluation. In order to stabilize tool wear and to suppress the sudden breakage of the small-diameter drill, it is effective to control skewness (Ssk) defined by ISO25178 among surface roughness in the surface evaluation regarding the surface of the chip discharge groove 6. Here, skewness (Ssk) is an index representing the relativity of the height distribution. If the hard coating has many protrusion parts, the value of skewness (Ssk) becomes larger than 0. On the other hand, if the hard coating has many recessed parts, the value of skewness (Ssk) becomes smaller than 0. Even if the arithmetic mean roughness Ra and the maximum height roughness Rz, which are general surface roughness, are smoothed, in a case where the skewness (Ssk) value is large, the protrusion parts of the chip discharge groove 6 increase, and thus the chips tend to be clogged. As a result, the breakage resistance is lowered or the tool wear tends to become unstable.

Thus, in the present embodiment, the protrusion parts on the surface of the chip discharge groove 6 can be reduced by setting skewness (Ssk) defined by ISO25178 to less than 0 on the surface of the chip discharge groove 6. As a result, the chip clogging is easily suppressed, the tool wear is stabilized, and thereby the sudden breakage can also be suppressed. Additionally, if the skewness (Ssk) becomes too large on the minus side, there is a possibility that the number of the recessed part increases and the chip clogging occurs. Therefore, it is desirable that the surface of the chip discharge groove 6 on which the hard coating is formed has a skewness (Ssk) of −0.30 or more and less than 0. It is more desirable to set it to −0.20 or more and less than 0.

In the present embodiment, the arithmetic mean height Sa (μm) of the surface defined by ISO25178 is 0.2 μm or less with respect to the surface of the chip discharge groove 6 on which the hard coating is formed. In addition, the maximum height Sz (μm) is 2.0 μm or less.

In the present embodiment, in addition to the surface roughness of the hard coating formed in the chip discharge groove 6, defects included in the hard coating are reduced. Specifically, in cross-section observation of the hard coating, the number of droplets having an equivalent circle diameter of 1.0 μm or more is 5 or less per 100 μm2. Accordingly, sudden breakages are less likely to occur. The number of droplets having the equivalent circle diameter of 1.0 μm or more is 2 or less per 100 $\mu m^2$. Furthermore, it is desirable that droplets having an equivalent circle diameter of 3.0 μm or more are not included.

In addition, in order to make the surface of the chip discharge groove 6 smooth in this way, it is desirable to coat a surface of a smooth substrate, in which cutting marks are reduced by smoothing machining, with a hard coating by a sputtering method capable of coating a smooth hard coating with less generation of droplets, and then ejecting abrasive against the surface of the hard coating through blasting or the like to perform smoothing machining. As the smoothing machining, a polishing method using an abrasive having diamond particles and humidity, and using a mirror finishing apparatus (for example, aero wrap (registered trademark)) that polishes with a friction force generated by sliding the coating on a substrate at high speed may be selected. Furthermore, as the smoothing machining, a polishing method using a mirror surface shot machine that ejects an abrasive having elasticity and adhesiveness without using air may be selected. As a mirror surface shot machine for performing such a polishing method, a SMAP of joint-stock company Kamei Iron Works can be exemplified.

In addition, the hard coating is preferably a nitride which is a coating type having excellent heat resistance and wear resistance. Furthermore, among sputtering methods, it is desirable to apply a high-power sputtering method in which a high power is applied to the target, so that a hard coating having higher durability can be obtained. The maximum power density of the power pulse applied to the target is preferably 1.0 kW/cm² or more. Accordingly, it is possible to form the hard coating having excellent durability. For the same reason, the maximum power density of the power pulse is more preferably 3.0 kW/cm² or less.

The surface roughness of the chip discharge groove 6 to be evaluated in the invention may be obtained by measuring a portion coated with the hard coating.

It is preferable that the above-described hard coating made of the nitride has a coating structure in which a nitride containing Ti and Si is provided on an upper layer of the nitride which is a base layer. The nitride has excellent adhesion to the cemented carbide, which is the substrate. Therefore, a coating structure having more excellent durability than a single layer is obtained by forming the nitride containing Ti and Si having excellent wear resistance on the upper layer. In addition, the hard coating coated by the sputtering method contains Ar as a nonmetallic element. However, a content ratio of Ar is desirably 0.5 atomic % or less with respect to the total amount of the metallic element and the nonmetallic element.

In the present embodiment, the hard coating may not be provided on the entire cutting edge part 3. It is desirable that the hard coating is provided at a place having a tip side and a margin part. Moreover, in the embodiment, if the skewness is less than 0 with respect to at least the hard coating provided on the surface of the chip discharge groove 6, it is possible to achieve an effect of improving the chip discharge performance. Therefore, in the embodiment, the skewness (Ssk) may be less than 0 on the surface of the hard coating provided on the surface of the chip discharge groove.

The thickness of the hard coating is preferably 0.5 µm or more and 5 µm or less. The wear resistance is improved by setting the thickness of the hard coating to 0.5 µm or more. In addition, coating exfoliation hardly occurs by setting the thickness of the hard coating to 5 µm or less. For the same reasons, the thickness of the hard coating is preferably 1 µm or more and 3 µm or less.

Examples

Next, effects of the invention will be demonstrated by taking Examples of the invention. As Example, the influence in a case where the surface of the chip discharge groove 6 was coated with the hard coating and smoothed was evaluated. In Example, same-shape and same-size small-diameter drill, made of cemented carbide based on the above embodiment, in which the diameter D of the cutting edge 7 was 1 mm, the groove length was 33 mm, the margin length L was 12 mm, and the shape of the cutting edge part 3 as seen from the tip side in the direction of the axis O was as illustrated in FIG. 2 were evaluated as samples 1 to 9.

Among these, in samples 1 to 3, an entire surface of the cutting edge part 3 including the surfaces of the chip discharge groove 6 was first coated with a nitride coating of Al and Ti by about 1 µm by sputtering method, and then the entire surface was coated with a nitride coating of Ti and Si by about 1 µm which is an average coating thickness. Then, using the aero wrap which is the mirror finishing apparatus, an abrasive was ejected on the surface of the drill for the smoothing machining.

In addition, samples 4 to 6 are manufactured by method that the entire surface of the cutting edge part 3 including the surfaces of the chip discharge groove 6 was first coated with the nitride coating of Al and Ti by about 1 µm by sputtering method, and then the entire surface was coated with the nitride coating of Ti and Si by about 1 µm.

In samples 1 to 6, the hard coating was coated by applying a power pulse having a maximum power density of 2.25 kW/cm² by the high-power sputtering method in which a negative bias voltage was applied to a substrate and momentarily high power was applied to a target. In samples 1 to 6 coated by the sputtering method, droplets in which an equivalent circle diameter is 1.0 µm or more inside the hard coating were 3 or less per 100 µm². The Ar content ratio was about 0.3 atomic % with respect to the total amount of the metal element and the nonmetal element.

In addition, in samples 7 to 9, the entire surface of the cutting edge part 3 including the surfaces of the chip discharge groove 6 was also coated with the nitride coating of Al and Ti by about 1 µm by arc ion plating method, and then the entire surface was coated with the nitride coating of Ti and Si by about 1 µm which is an average coating thickness. Then, using the aero wrap which is the mirror finishing apparatus, an abrasive was ejected on the surface of the drill for the smoothing machining.

Next, the arithmetic mean height Sa (µm), the maximum height Sz (µm), and the skewness (Ssk) of the surface defined by ISO25178 for the chip discharge groove 6 formed with the hard coating in the small-diameter drills of samples 1 to 9 were measured. The measurement place was a chip discharge groove 6 including a rake face near the cutting edge. In addition, an observation was made at a magnification of 50 times with a cutter value of 0.25 mm using a shape analysis laser microscope (VK-X250) made by KEYENCE CORP. for the measurement, three regions of 60 µm×100 µm were measured, and a measurement value was calculated from a measurement average in the regions.

TABLE 1

|  | Sa (µm) | Sz (µm) | Ssk | Number per 100 µm² of Droplets of 1.0 µm or more |
|---|---|---|---|---|
| Sample 1 | 0.057 | 1.322 | 0.085 | 3 or less |
| Sample 2 | 0.053 | 1.643 | −0.174 | 3 or less |
| Sample 3 | 0.026 | 0.629 | −0.042 | 3 or less |
| Sample 4 | 0.057 | 1.898 | 1.233 | 3 or less |
| Sample 5 | 0.059 | 2.634 | 3.134 | 3 or less |
| Sample 6 | 0.05 | 2.338 | 1.68 | 3 or less |
| Sample 7 | 0.063 | 2.27 | −0.635 | — |
| Sample 8 | 0.059 | 1.832 | −0.119 | — |
| Sample 9 | 0.045 | 1.655 | −0.363 | — |

Then, drilling of 3200 holes was performed on workpieces made of SUS304 of 150 mm×190 mm×40 mm for the small-diameter drill of samples 1 to 9 on non-step machining conditions of Vc=50 m/min, rotating speed=16000 min⁻¹, feed amount=0.02 mm/rev, feed speed=320 mm/min, and machined hole depth=28 mm.

Figure 3:
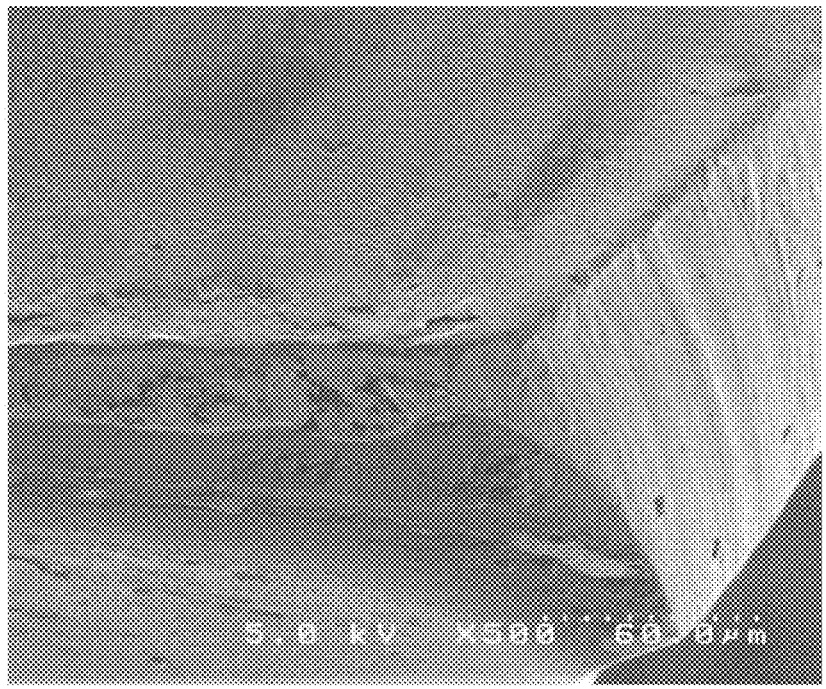
FIG. 3 is an observation photograph (×500 times) of a cutting edge of a small-diameter drill of sample 1 after drilling.
Figure 4:
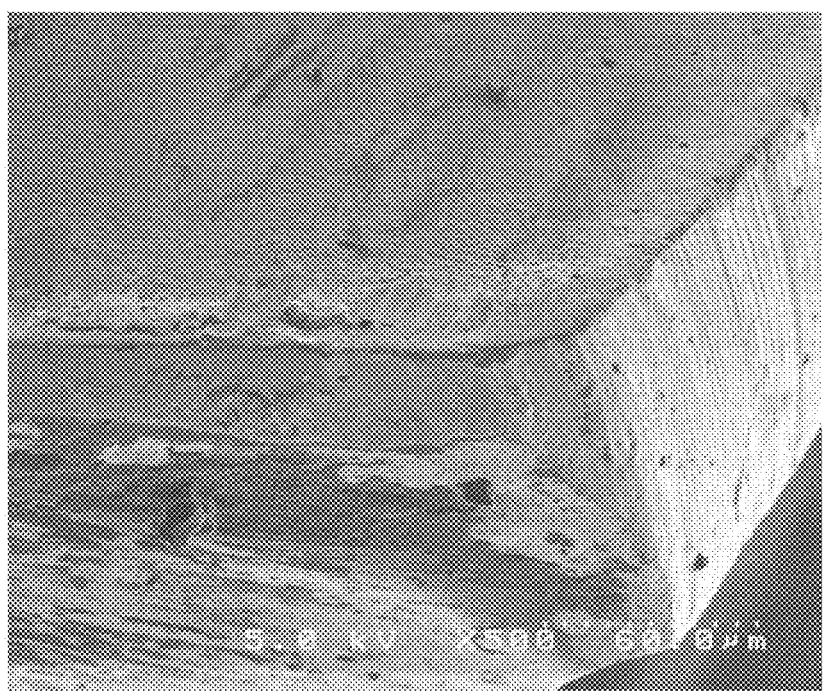
FIG. 4 is an observation photograph (×500 times) of a cutting edge of a small-diameter drill of sample 2 after drilling.
Figure 5:
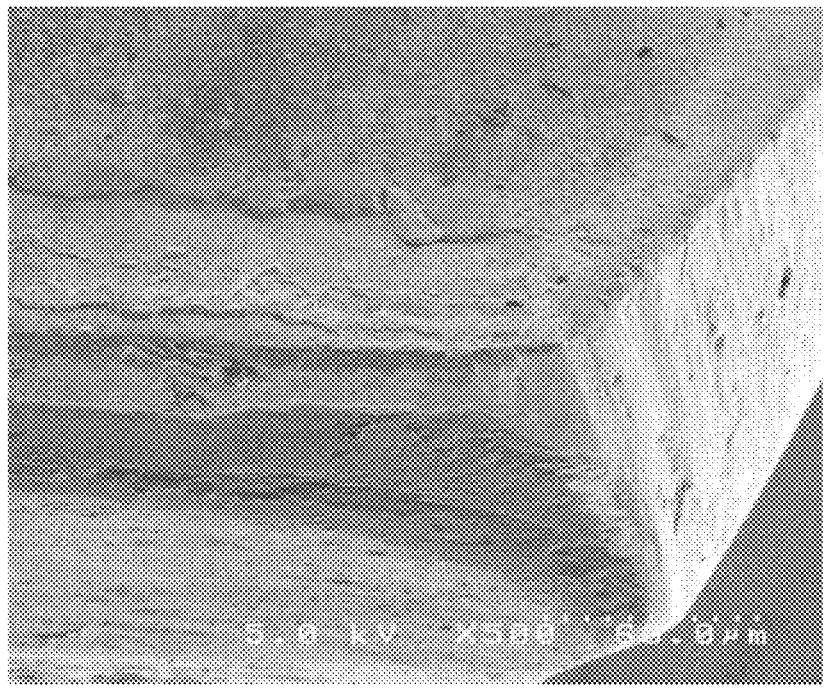
FIG. 5 is an observation photograph (×500 times) of a cutting edge of a small-diameter drill of sample 9 after drilling.

Under the test conditions, none of the samples was broken. However, the samples 1 to 6 coated by the sputtering method showed less wear on the rake face, the flank face, and margin part than the samples 7 to 9 coated by the arc ion plating method. This is presumably because the samples 1 to 6 were coated with a smooth hard coating with few droplets by selecting the sputtering method. FIG. 3 is an observation photograph (×500 times) of a cutting edge of a small-diameter drill of sample 1 after drilling. FIG. 4 is an observation photograph (×500 times) of a cutting edge of a small-diameter drill of sample 2 after drilling. FIG. 5 is an observation photograph (×500 times) of a cutting edge of a small-diameter drill of sample 9 after drilling. In FIGS. 3, 4, and 5, a corner portion extending in the horizontal direction of the photograph at the center of the vertical direction of a photograph is the main cutting edge 7a of each small-diameter drill. In a case where the observation photographs of sample 1, sample 2, and sample 9 are compared, it can be confirmed that a wear width is larger in the vicinity of the main cutting edge 7a of sample 9 than sample 1 and sample 2. Samples 1 and 2 have hard coatings formed by the sputtering method. On the other hand, sample 9 has a hard coating formed by the arc ion plating method. Accordingly, it was confirmed that the hard coating formed by the sputtering method can more suppress wear of the cutting edge in the drilling than the hard coating formed by another method (here, the arc ion plating method).

Moreover, among samples 1 to 6, samples 2 and 3 in which the skewness (Ssk) of the chip discharge groove is less than 0 have a smaller maximum wear width, stable tool wear, and more stable tool damage. It is considered that when the skewness (Ssk) is less than 0, the protrusion parts on the surface of the coating is reduced, and the tool wear is easily stabilized without local wear.

REFERENCE SIGNS LIST

1: drill body
2: shank part
3: cutting edge part
4: tapered neck part
5: tip flank face
5a: first tip flank face
5b: second tip flank face
6: chip discharge groove
7: cutting edge
7a: main cutting edge
7b: thinning edge
7c: chisel
8: thinning part
8a: thinning face
9: land part
10a: first margin part
10b: second margin part
10c: outer peripheral relief face
11: heel
12: coolant hole
O: axis of drill body 1
T: drill rotation direction
D: diameter of cutting edge 7
L: margin length
W: length of main cutting edge 7a as seen from tip side in direction of axis O
M1: first intersecting ridgeline
M2: second intersecting ridgeline
N1: first extension line
N2: second extension line
d1: distance between first extension line N1 and the first intersecting ridgeline M1 as seen from tip side in direction of axis O
d2: distance between second extension line N2 and second intersecting ridgeline M2 as seen from tip side in direction of axis O

The invention claimed is:

1. A small-diameter drill in which two chip discharge grooves opening to tip flank faces of a drill body that rotates around the axis and extending to a rear end side are formed symmetrically with respect to an axis at an outer periphery of a tip part of the drill body, cutting edges are formed at intersecting ridgeline parts between wall faces of the chip discharge grooves that face a drill rotation direction and the tip flank faces, a first margin part adjacent to a side of the chip discharge groove opposite to the drill rotation direction, and a second margin part adjacent to a side of the chip discharge groove in the drill rotation direction are formed on a land part between the chip discharge grooves, and a diameter D of the cutting edge is 2 mm or less, wherein a ratio L/D of a margin length L in a direction of the axis from an outer peripheral end of the cutting edge to a rear end of each of the first and second margin parts, and the diameter D is 3 or more, wherein a hard coating is provided on a surface of the drill body, wherein the hard coating contains 0.5 atomic % or less of Ar with respect to the total amount of the metallic element and the nonmetallic element, wherein a surface of the hard coating in the chip discharge groove has skewness (Ssk) defined in ISO25178 of less than 0, wherein the number of droplets having an equivalent circle diameter of 1.0 μm or more is 5 or less per 100 μm$^2$ in cross-section observation of the hard coating, and wherein the droplets having an equivalent circle diameter of 3.0 μm or more are not included.

2. The small-diameter drill according to claim 1, wherein a thinning part is formed at an inner periphery of a tip part of the chip discharge groove, wherein the thinning part has a thinning face that faces a side opposite to the drill rotation direction, and wherein the second margin part is formed from the tip flank face to the thinning face along a circumferential direction.

3. A manufacturing method of a small-diameter drill in which a diameter D of a cutting edge is 2 mm or less, the method comprising:

a step of forming a hard coating by a sputtering method; and a step of polishing a surface of the hard coating in a chip discharge groove to have skewness (Ssk) defined by ISO25178 of less than 0 by ejecting an abrasive against the surface of the hard coating, wherein the hard coating contains 0.5 atomic % or less of Ar with respect to the total amount of the metallic element and the nonmetallic element, wherein the number of droplets having an equivalent circle diameter of 1.0 μm or more is 5 or less per 100 μm$^2$ in cross-section observation of the hard coating, and wherein the droplets having an equivalent circle diameter of 3.0 μm or more are not included.

4. The manufacturing method of the small-diameter drill in according to claim 3, wherein a maximum power density of a power pulse applied to a target is 1.0 kW/cm² or more in the sputtering method.

\* \* \* \* \*